US012150252B2

(12) United States Patent
Chen et al.

(10) Patent No.: US 12,150,252 B2
(45) Date of Patent: *Nov. 19, 2024

(54) ELECTROMAGNETIC COMPATIBILITY CONTACT BETWEEN METAL CASTINGS AND PRINTED CIRCUIT BOARDS

(71) Applicant: Harman International Industries, Incorporated, Stamford, CT (US)

(72) Inventors: Jianing Chen, Northville, MI (US); Jon Curry, Commerce Township, MI (US); David Jia, Canton, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 12 days.

This patent is subject to a terminal disclaimer.

(21) Appl. No.: 18/193,823

(22) Filed: Mar. 31, 2023

(65) Prior Publication Data
US 2023/0240021 A1 Jul. 27, 2023

Related U.S. Application Data (62) Division of application No. 17/463,832, filed on Sep. 1, 2021, now Pat. No. 11,641,718.

(51) Int. Cl.
*H05K 1/02* (2006.01)
*H01L 23/367* (2006.01)
(Continued)

(52) U.S. Cl.
CPC ......... *H05K 3/3457* (2013.01); *H05K 1/0215* (2013.01); *H05K 5/0008* (2013.01)

(58) Field of Classification Search
CPC ...... H05K 1/02; H05K 1/0213; H05K 1/0215; H05K 1/115; H05K 1/145; H05K 1/181; H05K 1/184; H05K 3/341; H05K 3/3457; H05K 5/0008; H05K 5/0052; H05K 5/04; H05K 5/06; H05K 5/062; H05K 7/142; H05K 7/205; H05K 7/20854; H05K 9/0028; H05K 9/0032; H05K 9/0049;
(Continued)

(56) References Cited

U.S. PATENT DOCUMENTS 3,665,136 A * 5/1972 Gaber ................. H01H 51/287
200/283
4,658,334 A 4/1987 McSparran et al.
(Continued)

FOREIGN PATENT DOCUMENTS

DE 102008003787 A1 7/2009
EP 0727932 A2 8/1996
(Continued)

*Primary Examiner* — Xiaoliang Chen
(74) *Attorney, Agent, or Firm* — Angela M. Brunetti (57) ABSTRACT

An electronic device having at least one circuit board. The circuit board has a predetermined pattern of solder bumps facilitating a ground connection with a first enclosure member and/or a second enclosure member. The at least one circuit board is sandwiched between the first and second enclosure members, each of the first and second enclosure members has a surface facing the circuit board and the surface facing the circuit board has a bead extending therefrom contacting the predetermined pattern of solder bumps to complete the ground connection.

5 Claims, 6 Drawing Sheets

(51) Int. Cl.
*H05K 3/34* (2006.01)
*H05K 5/04* (2006.01)
*H05K 5/06* (2006.01)
*H05K 5/00* (2006.01)

(58) Field of Classification Search
CPC .......... H05K 2201/09072; H05K 2201/09754; H05K 2201/0999; H05K 2201/10189; H05K 2201/10295; H05K 2201/10303; H01L 23/3677; H01L 23/4006
USPC ......... 174/255, 372, 377; 361/818; 200/283; 29/592.1
See application file for complete search history.

(56) References Cited

U.S. PATENT DOCUMENTS

| | | | |
|---|---|---|---|
| 2011/0226523 A1 | 9/2011 | Tamaki et al. | |
| 2012/0281386 A1* | 11/2012 | Kim | H05K 9/0028 |
| | | | 361/818 |
| 2014/0262473 A1* | 9/2014 | Robinson | H05K 1/181 |
| | | | 174/372 |
| 2018/0098431 A1* | 4/2018 | Park | H01R 4/58 |
| 2022/0030737 A1* | 1/2022 | Akiyama | H05K 5/04 |

FOREIGN PATENT DOCUMENTS

| | | |
|---|---|---|
| EP | 0727932 A3 | 5/1997 |
| EP | 2230892 A1 | 9/2010 |
| EP | 3240387 A1 | 11/2017 |
| EP | 3316666 A1 | 5/2018 |

* cited by examiner

ELECTROMAGNETIC COMPATIBILITY CONTACT BETWEEN METAL CASTINGS AND PRINTED CIRCUIT BOARDS

CROSS REFERENCE

This application is a divisional of co-pending U.S. application Ser. No. 17/463,832, filed Sep. 1, 2021, the disclosure of which is incorporated in its entirety by reference.

TECHNICAL FIELD

The present disclosure relates to electromagnetic compatibility (EMC), and more particularly to optimizing electrical contact between metal castings and printed circuit boards.

BACKGROUND

EMC is a measure of an electronic device's ability to function acceptably in an operating environment without affecting the ability of other devices to operate in the same environment. This is particularly relevant for electronic devices that house one or more circuit boards, such as printed circuit boards (PCBs), that have an internal network of grounded conductive components mounted on the circuit board. Without proper shielding, other devices external to the electronic device or other components on the circuit board may adversely affect EMC.

For an electronic device having one or more circuit boards enclosed in metal castings, EMC may be affected by components on the circuit board itself, by components on multiple circuit boards stacked near each other, and by devices that are external to the enclosure. Properly shielding a component will prevent any adverse effects on EMC.

Typically, shielding is accomplished by attempting to create consistent connections to a common ground plane and in the case of electronic devices having circuit boards in metal enclosures, the enclosure is grounded for redirecting electrical interference.

To achieve a consistent connection to ground, circuit boards may have one or more contact points for fasteners around its perimeter to facilitate grounded contact with an enclosure. Typically, one or more circuit boards are attached to first and second faces of the enclosure with fasteners, such as screws or clips. The more fasteners that are used to attach the circuit boards, the more consistent the ground contact. However, for electronic devices having multi-layer circuit boards, or large enclosures, fasteners such as screws and clips may be unavailable as an option. Additionally, the number of fasteners needed for a consistent connection may become too numerous thereby adversely affecting the cost of the circuit board/enclosure assembly. Yet another drawback of fasteners is that the clamping force they provide, particularly if they are over-tightened, may introduce stress that deforms or otherwise damages the circuit board, which can adversely affect EMC.

When too few fasteners are used, retention may be inconsistent, which may lead to ineffective electrical grounding. Furthermore, vibrations, particularly in automotive applications, may also cause fasteners to come loose, causing a loss of contact to ground adversely affecting EMC. Manufacturing tolerances and deformation of parts may also adversely affect EMC. There is a need for a consistent connection to ground to shield the electronic device from internal and external interference.

SUMMARY

An electronic device having at least one circuit board. The circuit board has a predetermined pattern of solder bumps facilitating a ground connection with a first enclosure member and/or a second enclosure member. The at least one circuit board is sandwiched between the first and second enclosure members, each of the first and second enclosure members has a surface facing the circuit board and the surface facing the circuit board has a bead extending therefrom contacting the predetermined pattern of solder bumps to complete the ground connection.

In one or more embodiments, the predetermined pattern of solder bumps is a first predetermined pattern of solder bumps around a perimeter of the circuit board and at least a second predetermined pattern of solder bumps around at least one component on an interior of the circuit board. The bead extends from the surface of the enclosure member facing the circuit board in a manner that contacts the first and the at least second predetermined patterns of solder bumps.

In one or more embodiments, at least a third enclosure member is positioned between the first and second enclosure members. The at least a third enclosure member has a first edge with a bead extending therefrom, a second edge with a bead extending therefrom, and a planar surface parallel to the first and second enclosure members. A first circuit board has a predetermined pattern of solder bumps facilitating a ground connection is sandwiched between the first enclosure member and the third enclosure member. At least a second circuit board, also having a predetermined pattern of solder bumps facilitating a ground connection, is sandwiched between the second enclosure member and the third enclosure member. The bead on any one of the first enclosure member or the third enclosure member contacts the predetermined pattern of solder bumps on the first circuit board to complete the ground connection and the bead on any one of the second enclosure member or the third enclosure member contacts the pattern of solder bumps on the at least a second circuit board to complete the ground connection. The first enclosure member and the third enclosure member are parallel to the first circuit board and spaced to accommodate components on the circuit board. The at least a third enclosure member and the second enclosure member are also spaced a predetermined distance to accommodate components on the circuit board.

Elements in the figures are illustrated for simplicity and clarity and have not necessarily been rendered according to any sequence. For example, steps that may be performed concurrently or in different order are illustrated in the figures to help to improve understanding of embodiments of the present disclosure.

DETAILED DESCRIPTION

While various aspects of the present disclosure are described with reference to an electronic device in an automotive application, the present disclosure is not limited to such embodiments, and additional modifications, applications, and embodiments may be implemented without departing from the present disclosure. In the figures, like reference numbers will be used to illustrate the same components. Those skilled in the art will recognize that the various components set forth herein may be altered without varying from the scope of the present disclosure.

Figure 1:
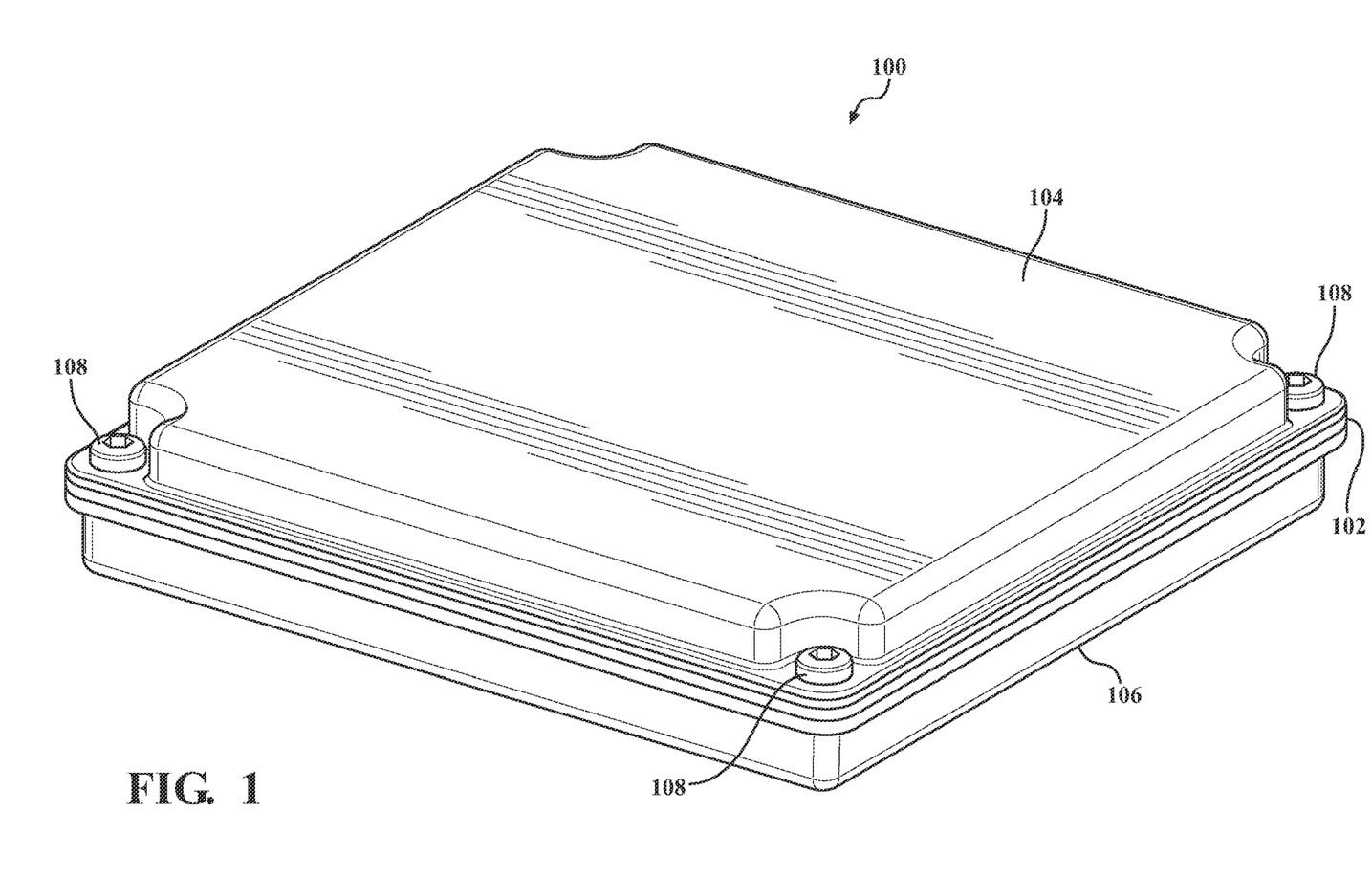
FIG. 1. is a perspective view of an electronic device.

FIG. 1 is a simplified representation, in a perspective view, of an electronic device 100 having at least one circuit board 102 clamped between a first enclosure member 104 and a second enclosure member 106. In practice, the circuit board 102 is sandwiched and fastened between the first and second enclosure members 104, 106 using fasteners 108, such as screws or clips, strategically placed predetermined distances from each other around a perimeter of the device 100.

Figure 2:
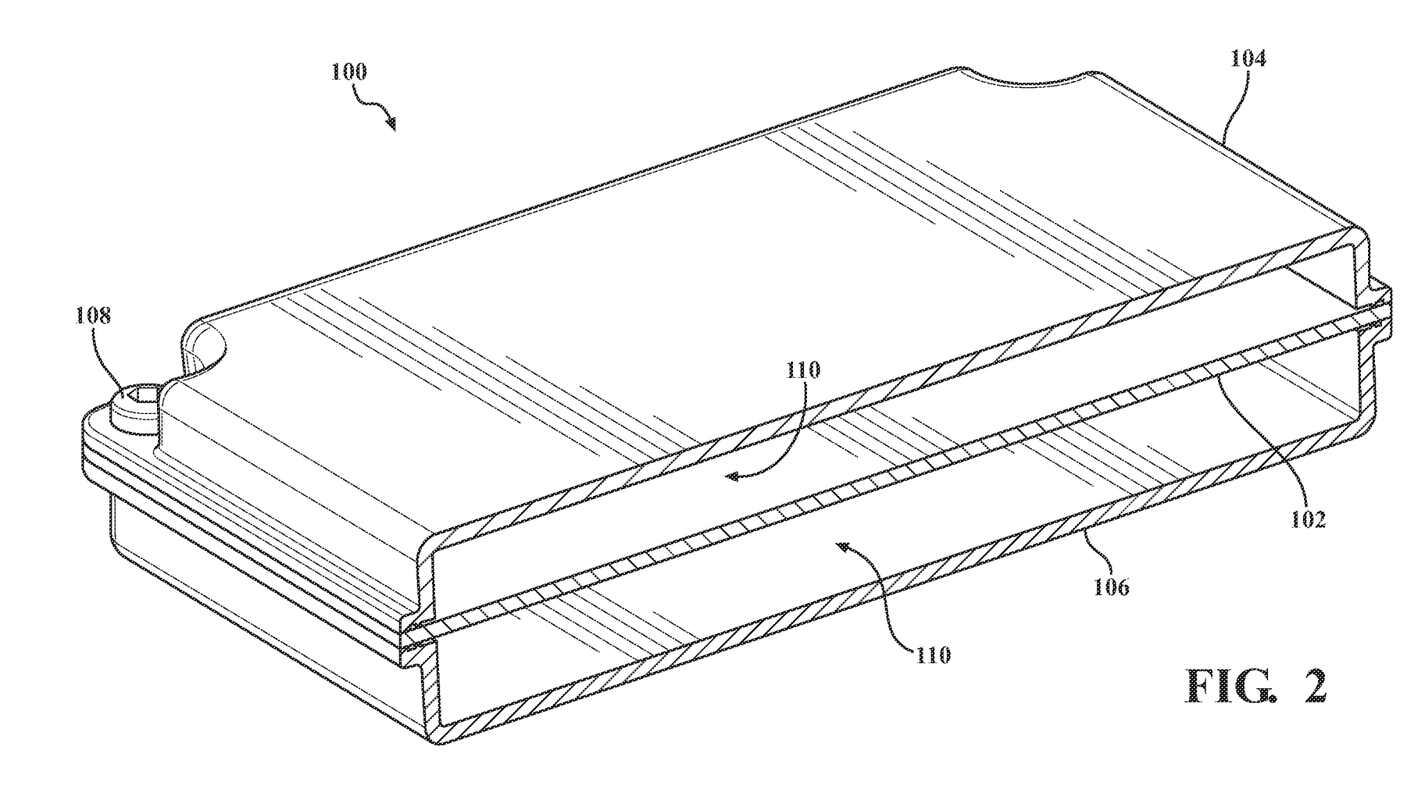
FIG. 2 is a cutaway view of the electronic device.

FIG. 2 is a cutaway view of the electronic device 100. The enclosure members 104, 106 are typically mounted to create an enclosure that is spaced a predetermined distance 110 around the circuit board 102 for clearance to accommodate electronic components on the circuit board and in the housing. Additionally, at least one enclosure member 104, 106 is configured to optimize EMC by providing a ground connection that shields components on the circuit board 102 from other components within the enclosure and shields the electronic device from electronic devices external to the enclosure. This is accomplished through a consistent contact to ground between the solder balls on the circuit board 102 and at least one of the first and second enclosure members 104, 106. It should be noted that the solder balls may be on one, or both, sides of the circuit board 102. At least one of the first and second enclosure members 104, 106 is formed from a material that provides shielding such as aluminum, magnesium, or steel.

Figure 3A:
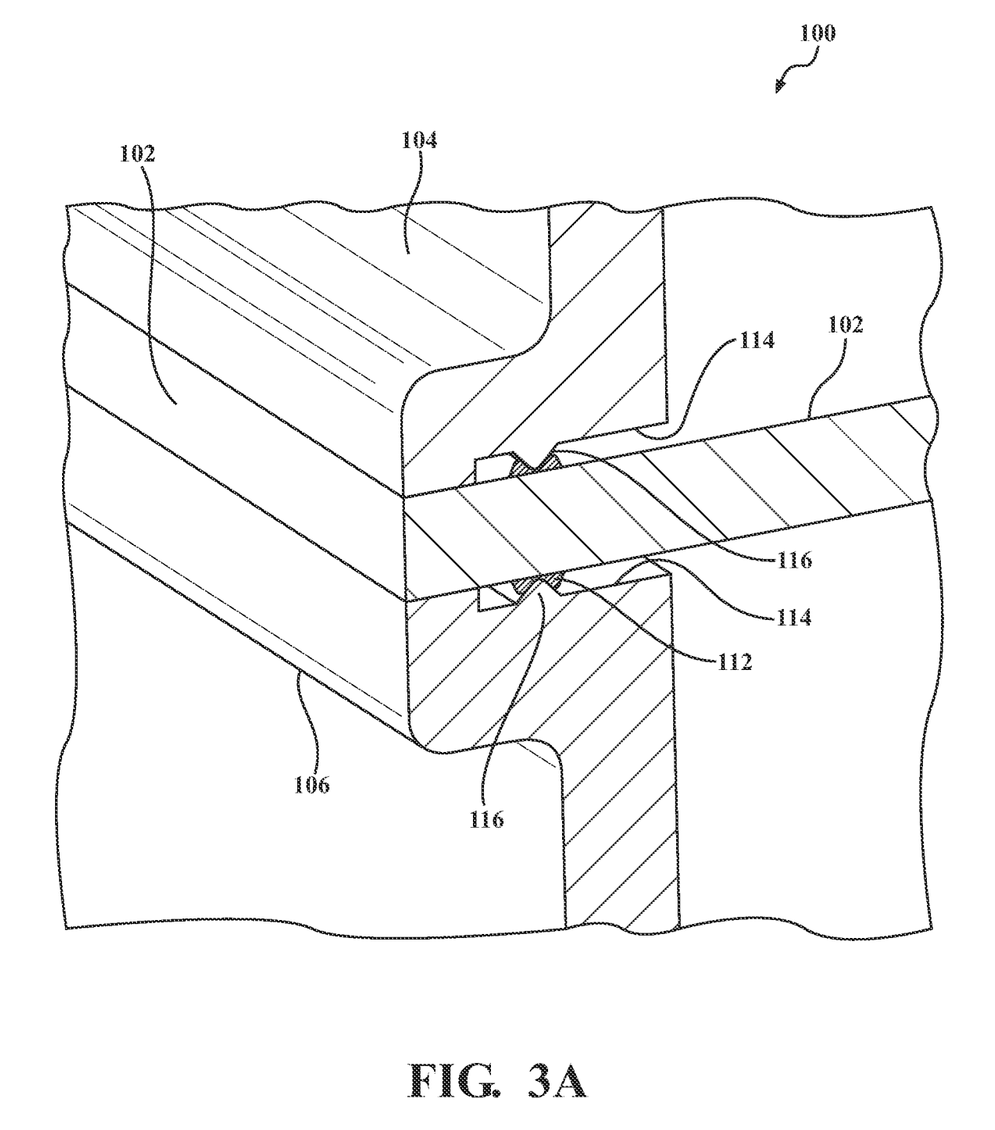
FIG. 3A is a close-up cutaway view of a bead contacting a pattern of solder bumps.

FIG. 3A is a close-up view of the electronic device 100 showing the enclosure members 104, 106 and the circuit board 102 in contact with each other along one or more contact zones. The contact zones are areas where the circuit board 102 and the enclosures 104, 106 make contact, and in the case of the example shown in FIG. 3A, the contact zones are an entire perimeter of each of the circuit board 102, the first enclosure member 104 and the second enclosure member 106.

Figure 3B:
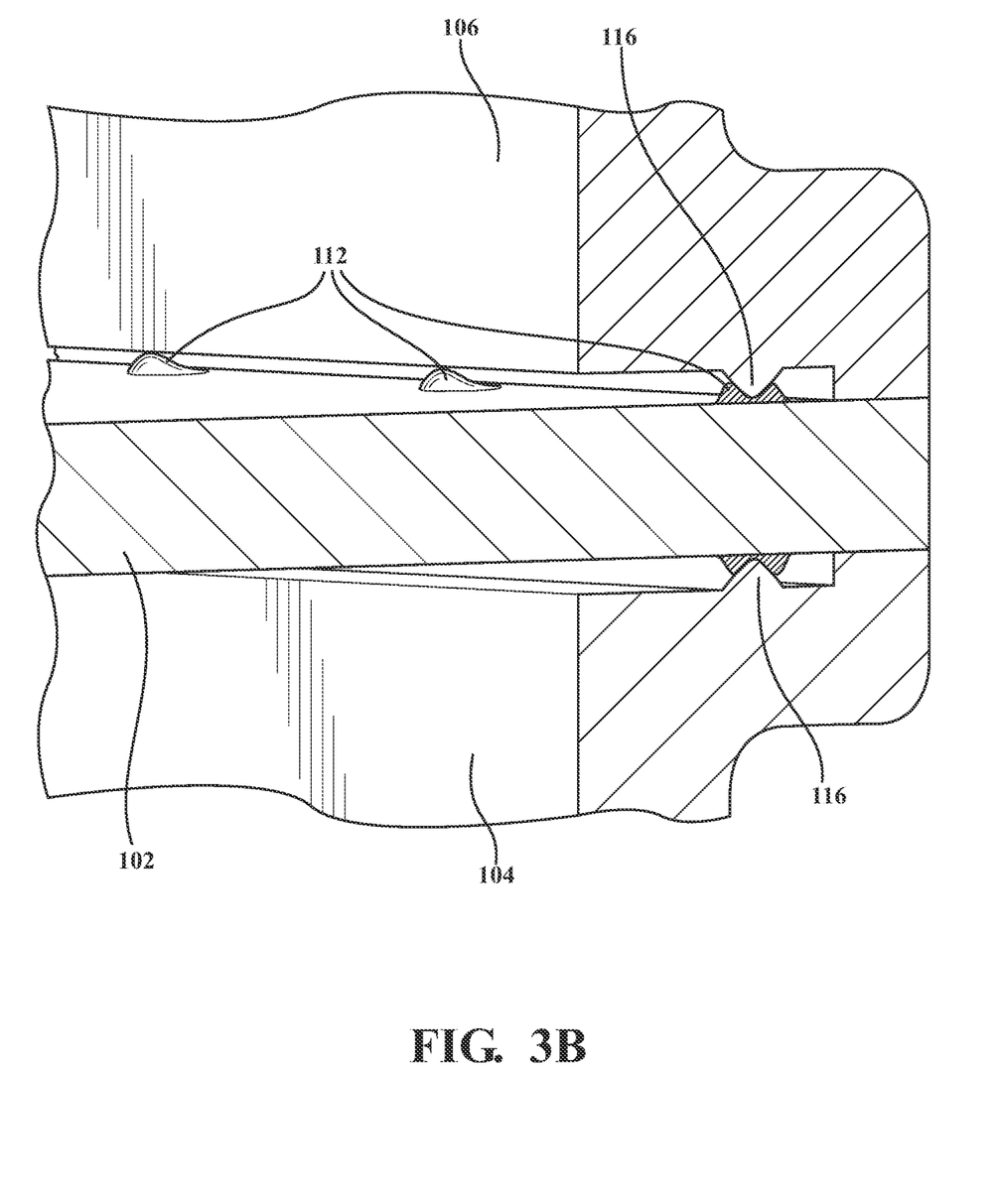
FIG. 3B is a perspective cutaway view of a bead contacting a pattern of solder bumps.
Figure 4:
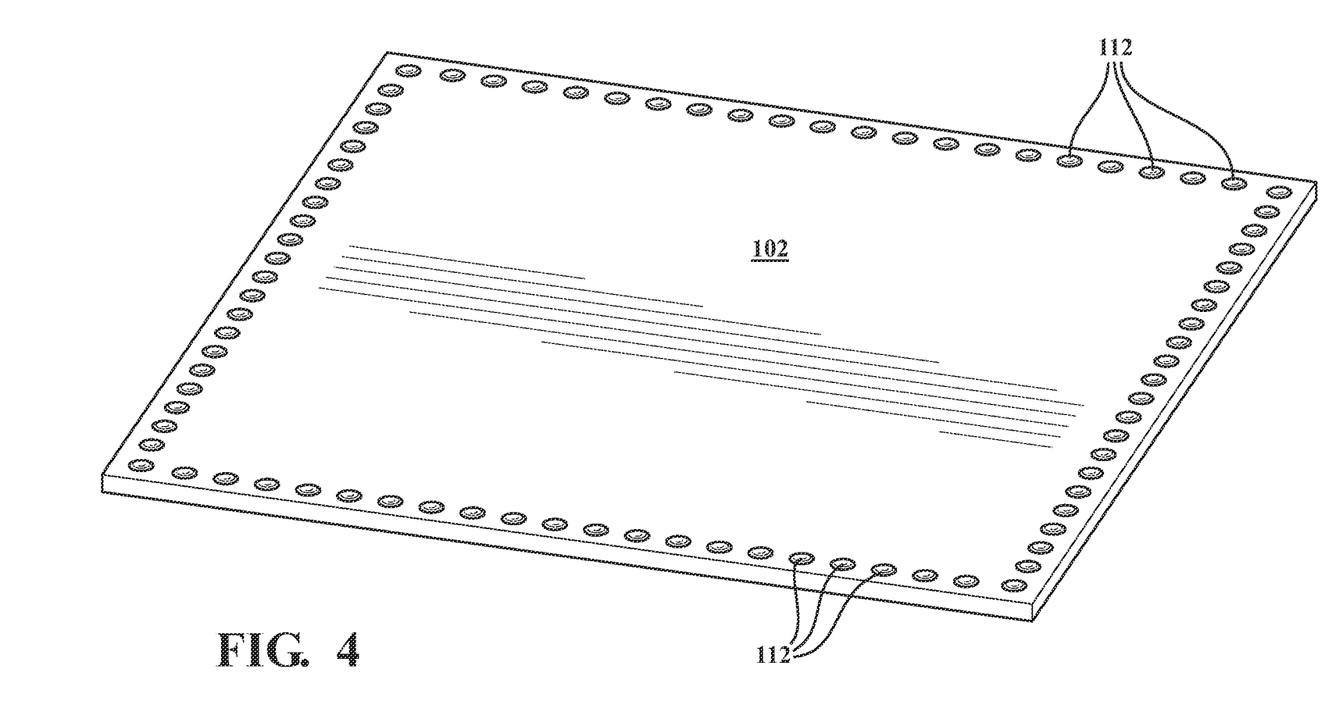
FIG. 4 is a circuit board having first and second predetermined patterns of solder bumps.

The contact zone of the circuit board 102 has a predetermined pattern of solder bumps 112, such as one row around its perimeter on each surface as shown in FIG. 4. Referring to FIG. 3B, a surface 114 of each enclosure member 104, 106 that faces the circuit board 102 has a bead 116 that protrudes from the enclosure member. The bead 116 has a predetermined pattern that substantially matches the predetermined pattern of solder bumps so that when the circuit board 102 is clamped between the enclosure members 104, 106, it consistently contacts the solder bumps 112. Instead of contact being consistently made only at the fastener locations, contact occurs at contact zones along the bead 116 on each enclosure member 104, 06 where it contacts the solder bumps 112 on the circuit board 102. In the example shown in FIGS. 3A and 3B, the contact is made all along the perimeter (or any other location where the bead 116, solder bump 112 connection may be introduced) to sustain sufficient electrical contact.

The bead 116 may be found on both enclosures (as shown) but it is necessary for the bead 116 on at least one of the enclosures 104, 106 to create an interference between the metallic casing of the enclosure 104 and/or 106 and a pattern of solder bumps 112 on the circuit board 102 to ensure electrical contact. In one or more embodiments, the bead 116 is triangular. A continuous bead 116 around the perimeter of the enclosures 104, 106 to sustain sufficient electrical contact and minimize any stresses that may be introduced into the circuit board 102. However, the bead 116 may have a different profile shape to accommodate design specifications and limitations.

As discussed above, the bead 116 may be around a perimeter of the enclosures 104, 106 and contacts the pattern of solder bumps that are on the perimeter of the circuit board 102 to facilitate a ground connection that protects the electronic device 100 from external interference and from causing excessive emissions. However, the bead 116 on the surface of at least one of the enclosure members 104, 106 that faces the circuit board 102 may also be implemented in other areas and have points of contact between at least one of the enclosure members 104, 106 and the circuit board 102 other than just the perimeter. For example, the bead may contact at least a second pattern of solder bumps on an interior of the circuit board 102 that, for example, surrounds a particular component on the board, to isolate and protect the component form internal interference.

Contact of the bead 116 with the pattern of solder bumps 112 on the circuit board 102 provides consistent electrical contact. Gaps in a ground connection could adversely affect EMC. The perimeter bead 116 provides consistent electrical contact even in areas where circuit board deformation might typically occur, such as the areas between fasteners. When fasteners are over-clamped during assembly, or when the circuit board is otherwise warped or deformed, gaps in ground contact may occur. Gaps may also occur when one or more of the fasteners comes loose, for example from vibrations of the electronic, such as road vibrations of a vehicle. The continuous contact of the bead 116 with the solder bumps 112 addresses these problems. The bead 116 on the enclosure members contacting the pattern of solder bumps 112 on the circuit board 102 provides a more consistent contact to ground than the fasteners alone.

Figure 5:
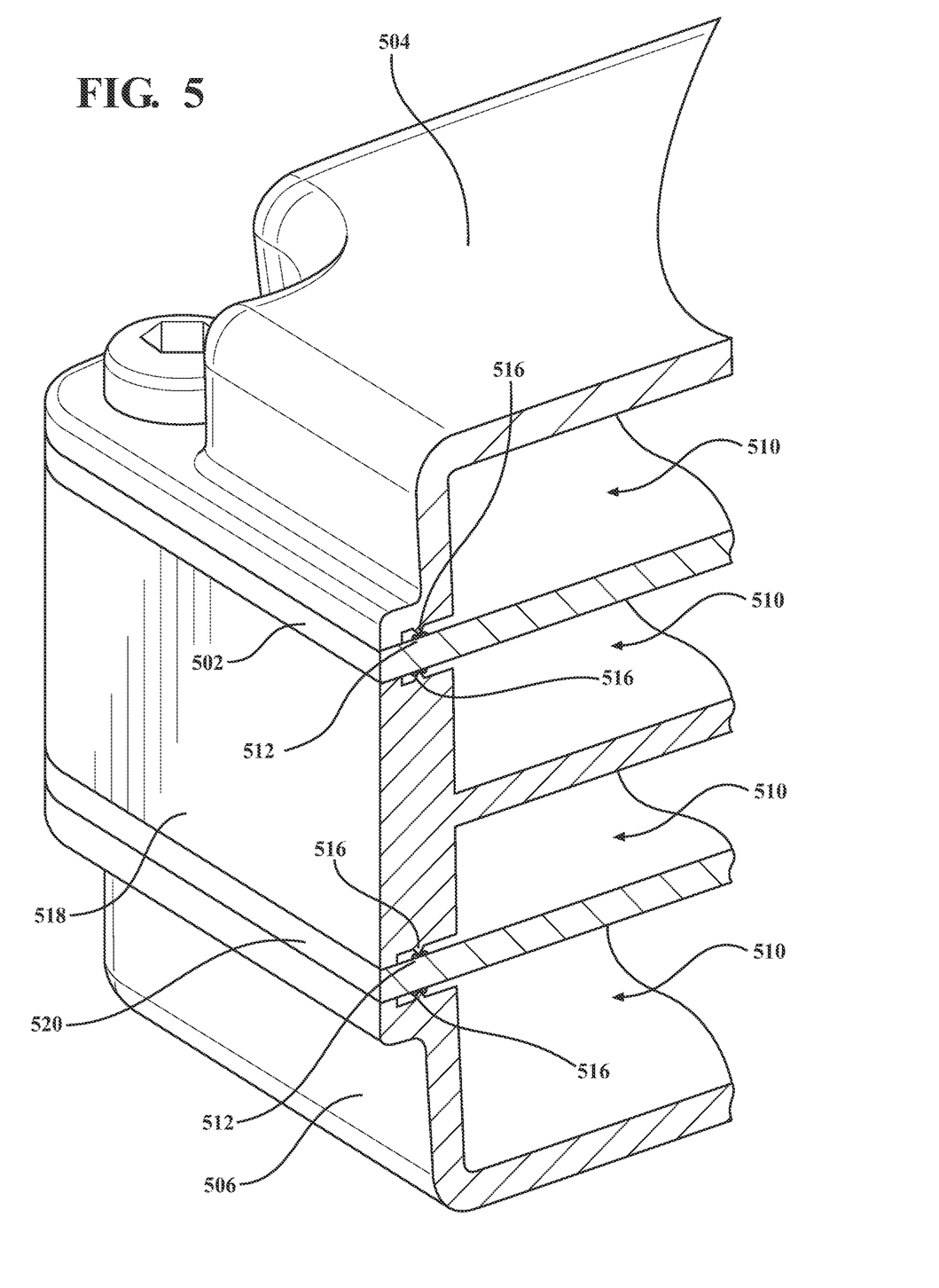
FIG. 5 is a perspective cutaway view of the electronic device having multiple circuit boards mounted in parallel.

FIG. 5 shows one or more embodiments 500 of the inventive subject matter having first 504, second 506 and at least a third 518 enclosure members. First 502 and second 520 circuit boards are enclosed by the enclosure members 504, 506, 518. The first and second circuit boards 502, 520 have a predetermined pattern of solder bumps 512, such as one row around a perimeter edge as shown in FIG. 4. Referring again to FIG. 5, The third enclosure member 518 is positioned between the first and second circuit boards 502, 520. Each of the enclosure members 504, 506 has a bead 516 that has a predetermined pattern substantially matching the pattern of solder bumps 512 for contacting the pattern of solder bumps 512 on either, or both, of the circuit boards 502, 520.

The third enclosure member 518 has a perimeter bead having a predetermined pattern, for example, along each edge so that it contacts the pattern of solder bumps 512 on at least one of the circuit boards 502, 520. The third enclosure member 518 also has a planar surface section that divides the enclosure to provide structural support for multiple circuit boards in parallel. The planar surface may also function as a heat sink for hot components on any one of the circuit boards. Within the enclosure, there is spacing 510 between each of the circuit boards 502, 520 and spacing between circuit boards and enclosure members. The spacing is a predetermined distance to accommodate any board-to-board connectors (not shown). The at least a third enclosure member may have a bead 516 on each of its surfaces to contact solder bumps on each of the circuit boards 502, 520. The third enclosure has a predetermined height so that, when it is connected between to the first and second circuit boards between the first and second enclosure members it completes the enclosure of the first and second circuit boards 502, 520. The assembly includes spaces 510 above and below the circuit boards 502, 520 for component clearance. Contact between the bead 516 on the first, second and at least a third enclosure members 504, 506, 518 with the pattern of solder bumps 512 on the first and second circuit boards 502, 520 ensures a continuous contact zone for consistent electrical contact to ground for the assembly.

In the foregoing specification, the present disclosure has been described with reference to specific exemplary embodiments. The specification and figures are illustrative, rather than restrictive, and modifications are intended to be included within the scope of the present disclosure. Accordingly, the scope of the present disclosure should be determined by the claims and their legal equivalents rather than by merely the examples described.

For example, the components and/or elements recited in any apparatus claims may be assembled or otherwise operationally configured in a variety of permutations and are accordingly not limited to the specific configuration recited in the claims.

Benefits, other advantages, and solutions to problems have been described above regarding specific embodiments. However, any benefit, advantage, solution to problem or any element that may cause any particular benefit, advantage, or solution to occur or to become more pronounced are not to be construed as critical, required, or essential features or components of any or all the claims.

The terms "comprise", "comprises", "comprising", "having", "including", "includes" or any variation thereof, are intended to reference a non-exclusive inclusion, such that a process, method, article, composition, or apparatus that comprises a list of elements does not include only those elements recited but may also include other elements not expressly listed or inherent to such process, method, article, composition, or apparatus. Other combinations and/or modifications of the above-described structures, arrangements, applications, proportions, elements, materials, or components used in the practice of the present disclosure, in addition to those not specifically recited, may be varied, or otherwise particularly adapted to specific environments, manufacturing specifications, design parameters or other operating requirements without departing from the general principles of the same.

What is claimed is:

1. An electronic device comprising:
   a plurality of circuit boards, each circuit board has a first predetermined pattern of solder bumps facilitating a ground connection for the electronic device;
   a plurality of enclosure members that enclose the plurality of circuit boards and create space between each enclosure member and each circuit board; and
   a first bead protruding from a perimeter edge of each enclosure member, the bead contacts the first predetermined pattern of solder bumps on the circuit board to complete a ground connection.

2. The electronic device of claim 1, wherein the bead is triangular.

3. The electronic device of claim 1 wherein the predetermined pattern of solder bumps further comprises at least one row of solder bumps around a perimeter of each circuit board in the plurality of circuit boards.

4. The electronic device of claim 1, wherein the predetermined pattern of solder bumps further comprises a row of solder bumps around a component on one circuit board of the plurality of circuit boards.

5. The electronic device of claim 1, wherein the predetermined pattern of solder bumps further comprises:
   a first predetermined pattern of solder bumps around a perimeter of one circuit board of the plurality of circuit boards, wherein the bead extends from a surface of at least one enclosure member facing the first predetermined pattern of solder bumps around a perimeter of the circuit board and contacts the first predetermined pattern of solder bumps to complete the ground connection;
   a second predetermined pattern of solder bumps around at least one component on an interior of one of the circuit boards in the plurality of circuit boards; and
   a second bead extending from at least one of the plurality of enclosure members, the second bead has a pattern that matches the second predetermined pattern of solder bumps, the second bead contacts the second predetermined pattern of solder bumps to isolate the at least one component.

* * * * *